United States Patent [19]

Sanders

[11] Patent Number: 4,483,912
[45] Date of Patent: Nov. 20, 1984

[54] IMAGING SYSTEM WITH MICROCAPSULES CONTAINING PHOTOHARDENABLE OR PHOTOSOFTENABLE COMPOSITION

[75] Inventor: Frederick W. Sanders, Chillicothe, Ohio

[73] Assignee: Mead Corporation, Dayton, Ohio

[21] Appl. No.: 576,238

[22] Filed: Feb. 2, 1984

Related U.S. Application Data

[63] Continuation-in-part of Ser. No. 458,749, Jan. 17, 1983, abandoned.

[51] Int. Cl.³ .................. G03C 5/54; G03C 1/68; G03C 1/495
[52] U.S. Cl. .................................... 430/138
[58] Field of Search .................. 430/138; 282/27.5

[56] References Cited

U.S. PATENT DOCUMENTS 4,399,209 8/1983 Sanders et al. ................ 430/138
4,440,846 4/1984 Sanders et al. ................ 430/138

FOREIGN PATENT DOCUMENTS

| 124343 | 8/1982 | Japan | 430/138 |
| 179836 | 11/1982 | Japan | 430/138 |
| 197538 | 12/1982 | Japan | 430/138 |
| 17432 | 2/1983 | Japan | 430/138 |
| 23024 | 2/1983 | Japan | 430/138 |
| 23025 | 2/1983 | Japan | 430/138 |
| 45084 | 3/1983 | Japan | 430/138 |
| 45090 | 3/1983 | Japan | 430/138 |

*Primary Examiner*—Richard L. Schilling
*Attorney, Agent, or Firm*—Biebel, French & Nauman

[57] ABSTRACT

Means are provided for preventing image diffusion in images formed by imagewise exposure of a microencapsulated photosensitive material to actinic radiation, followed by a color forming reaction between a chromogenic material and a developer. A curing agent for the photosensitive composition, such as an organic peroxide, is microencapsulated separately from the photosensitive material and included in the coating. When the capsules are ruptured, the released curing agent reacts with the photosensitive material and thereby stabilizes the formed color so that its quality will not deteriorate over time.

18 Claims, No Drawings

IMAGING SYSTEM WITH MICROCAPSULES CONTAINING PHOTOHARDENABLE OR PHOTOSOFTENABLE COMPOSITION

CROSS-REFERENCE TO RELATED APPLICATION

This application is a continuation-in-part of application Ser. No. 458,749 filed Jan. 17, 1983 and now abandoned.

BACKGROUND OF THE INVENTION

The present invention relates to the production of photographs, photocopies, or other fixed images. More specifically, it is an imaging system which employs a coated substrate which contains a chromogenic material and a microencapsulated photosensitive composition. In the most preferred embodiment of this invention the chromogenic material and photosensitive composition are in the same microcapsules.

Several known imaging systems employ photosensitive encapsulates. One such imaging system which has significant advantages over all previously known ones is referred to generically as the Sanders process. This process employs a coating composition which is usually applied to a substrate. The coating includes a photosensitive composition which is encapsulated and a chromogenic material which may or may not be within the microcapsules. ("Encapsulated" is used herein to refer to both open phase systems in which the photosensitive composition is dispersed as droplets throughout a dispersing medium and systems in which there is a discrete capsular wall.) The microcapsules generally have a mean diameter of 1 to 25 microns. Images are formed by imagewise exposure of the coating composition to actinic radiation. ("Actinic radiation" is used herein to designate the entire spectrum of electromagnetic radiation.) "Imagewise" exposure means that radiation is applied in a pattern such that areas which are to be dark receive the most radiation while areas which are to be light receive little or no radiation, or vice versa. This can be accomplished, for example, by placing a stencil between the radiation source and the coating. Exposure can be through either direct transmission or reflection imaging.

After exposure, the microcapsules, or at least those in the image areas, can be ruptured by calendering or other suitable means. In the case of a photohardenable photosensitive composition, the viscosity of the photosensitive composition is increased substantially upon exposure to actinic radiation, through mechanisms such as cross-linking or simple polymerization. Therefore, when the capsules are broken, the photosensitive composition which received a strong exposure will flow very little, if at all, while the unexposed or weakly exposed photosensitive composition can flow relatively freely. As a direct result, the chromogenic material reacts imagewise with the developer according to the degree of exposure to form a color in the form of the desired image. This can occur several different ways.

In one embodiment, the chromogenic material is encapsulated with the photosensitive composition. Outside the capsules, a developer is contained in the coating, which is applied to a substrate. When the capsules are ruptured, the chormogenic material is available to flow, but its movement from the exposed capsules is restricted by the increased viscosity of the photosensitive compositions in those capsules. As a result, the accessibility of chromogenic material to developer depends on the exposure received locally. The developer and chromogenic material react according to the exposure to form the desired image. When this embodiment of a coating composition is applied to a substrate, the result is a self-contained imaging sheet.

In another embodiment, the photosensitive composition is encapsulated and the chromogenic material is within the coating inside or outside the capsules. A developer can be located as a separate layer from the chromogenic material in the coating, or can be on a separate substrate altogether. In the former situation, capsule rupture releases imagewise the photosensitive composition. The chromogenic material now reacts with the developer to form a color generally in the form of an image. In the latter situation, the two substrates are superimposed during capsule rupture so that the dissolved chromogenic material flows onto the developer sheet and reacts imagewise there.

In an alternative embodiment, the photosensitive composition can be a high viscosity substance which depolymerizes upon exposure to actinic radiation. In that case, the chromogenic material located in or near exposed capsules, instead of unexposed ones, is made accessible to the developer. This changes the imaging system from a positive one to a negative one.

The photosensitive composition includes a photoinitiator and a substance which undergoes a change in viscosity upon exposure to light in the presence of the photoinitiator. The substance may be a monomer, dimer, or oligomer which is polymerized to a higher molecular weight compound or it may be a polymer which is cross-linked. Alternatively it may be a compound which is depolymerized or otherwise lysed upon exposure. Radiation curable materials that are often used are materials curable by free radical initiated chain propagated addition polymerization or ionic polymerization.

Representative radiation curable materials are ethylenically unsaturated organic compounds. These compounds contain at least one terminal ethylenic group per molecule. Typically they are liquid at room temperature and can also double as a carrier oil for the chromogenic material in the internal phase. A preferred group of radiation curable materials is ethylenically unsaturated compounds having two or more terminal ethylenic groups per molecule. Representative examples of these compounds include ethylenically unsaturated acid esters of polyhydric alcohols such as trimethylol propane triacrylate or trimethacrylate, acrylate prepolymers derived from the partial reaction of pentaerythritol with acrylic or methacrylic acid or acrylic or methacrylic acid esters; isocyanate modified acrylate, methacrylic and itaconic acid esters of polyhydric alcohols, etc.

Some typical examples of photosoftenable materials useful in other embodiments are photolysable compounds such as certain diazonium compounds, 3-oximino-2-butanone methacrylate which undergoes main chain scission upon U.V. exposure and poly 4'-alkyl acylo-phenones.

Various photoinitiators are used. These compounds absorb the exposure radiation and generate a free radical alone or in conjunction with a sensitizer. Suitable photoinitiators include α-alkoxy phenyl ketones, Michler's ketone, O-acylated α-oximinoketones, polycyclic quinones, benzophenones and substituted benzophenones, xanthones, thioxanthones, halogenated compounds such as chlorosulfonyl and chloromethyl polynuclear aromatic compounds, chlorosulfonyl and chloromethyl heterocyclic compounds, chlorosulfonyl and chloromethyl benzophenones and fluorenones, haloalkanes, α-halo-α-phenylacetophenones; photoreducible dye-reducing agent redox couples, halogenated paraffins (e.g., brominated or chlorinated paraffin) benzoin alkyl ethers, etc.

The above-described embodiments are only a few of the possible variations on the Sanders process. The means and methods of each comprise an imaging system which has substantial practical, commerical and functional advantages over prior art imaging systems. Various aspects of this process are disclosed in the following co-pending applications, which are incorporated herein by reference: Ser. No. 302,356 filed Nov. 12, 1981 now U.S. Pat. No. 4,399,209; Ser. No. 320,643 filed Nov. 12, 1981 now U.S. Pat. No. 4,440,846; and Ser. No. 339,917 filed Jan. 18, 1982.

After exposure and capsule rupture, the oil phase (i.e., the photosensitive composition and the chromogenic material) migrates to the developer layer which is on the same substrate as the microcapsules in a self-contained imaging sheet and on a separate substrate in a transfer sheet.

Some of the color formed is retained in the photosensitive oil phase in a mobile solution after image formation. This is particularly true where large amounts of heavier photosensitive oils form the internal phase. If the photosensitive composition does not quickly react to visible light following capsule rupture and image formation, in some cases the image may bleed down into and across the imaging sheet, blurring and reducing the intensity of the image. This effect is sometimes referred to as "feathering".

SUMMARY OF THE INVENTION

The present invention solves the problem of image diffusion in the Sanders process imaging system by including an agent in the coating composition which reacts with the photosensitive composition released from the microcapsules following exposure (more particularly the photohardenable or photosoftenable species) and cures or otherwise hardens it. This agent (hereinafter referred to as "a curing agent") is typically a free radical generating species such as a thermal initiator. While one might expect that the photosensitive composition released from the microcapsules in the image areas could be hardened by a subsequent exposure with actinic radiation, this has not been found to be effective. In instances where image diffusion occurs, it has been found desirable to incorporate a curing agent in the composition for subsequent reaction with the released photosensitive composition.

The curing agent is preferably encapsulated. It may be contained in the same capsules as the photosensitive composition or in separate photoinert capsules. The latter is preferred. If included in the same photoactive capsules, the effect will be the same at first, but precuring of the capsule contents may begin to occur in some cases, and all photosensitivity may be lost in a few days. An inert oil carrier can be included in the capsules containing the curing agent to facilitate flow and curing on rupture.

The curing agent is preferably selected on the basis of shelf-life, reactivity with the photosensitive composition, lack of solubility in water, solubility in an inert oil carrier, low hydrolysis rate in the presence of water phases having a pH ranging from about 3.5 to 9.5, ease of encapsulation, and other characteristics consistent with known encapsulation techniques.

By exposing a coating of the composition, rupturing the capsules alone (in the case of a self-contained system) or in contact with a developer sheet, and preferably heating the image to activate the curing agent or accelerate curing, stable images can be formed. The chromogenic material reacts with the developer to form a color image and the curing agent hardens the photosensitive composition released from the capsules to prevent image diffusion.

Besides greatly reducing image diffusion, this will improve smudge resistance and solvent resistance and make the images more scuff proof.

DETAILED DESCRIPTION OF THE INVENTION

The present invention is an improvement of an imaging system which employs a coating of a microencapsulated photosensitive composition, a chromogenic material which may or may not be inside the capsules, and a developer which can be included in the coating or provided on a separate substrate wherein images are formed by imagewise exposing the coated substrate to actinic radiation and then rupturing the capsules. If the developer is on a separate substrate, the two substrates are superimposed while the capsules are ruptured. In these systems after the image develops, some color remains dissolved in the photosensitive phase released from the capsules, and can bleed through and across the substrate, harming image definition and intensity unless the photosensitive phase is reacted.

The preferred embodiment of this invention includes a chemical (essentially non-photosensitive) curing agent for the photosensitive composition in the coating composition. The function of the curing agent is to cure the photosensitive composition after developing. Once the color has been formed, the rapid hardening of the photosensitive composition prevents over-development and diffusion. The chemically cured photosensitive composition is thus "frozen" and the color remains in place and does not diffuse. The curing agent is suitably encapsulated with an inert carrier in capsules separate from those containing the photosensitive composition. Maintaining separate encapsulation prevents precuring, which could interfere with the imaging system's photosensitivity in a matter of days.

Selecting the curing agent and inert carrier oil for encapsulation requires consideration of the capsule wall material, conditions prevailing in the waterless phase outside the capsules, and storage temperatures. Further bases for selecting a curing agent include lack of solubility in water, solubility in the inert carrier oil (which itself should be compatible with the oil phase in the photosensitive composition's capsules), a relatively low hydrolysis rate in water phases having a pH between 3.5 and 9.5 for up to two huors at 40° to 50° C., ease of encapsulation, and other considerations with respect to encapsulation. It is important that the encapsulated curing agent have an adequate shelf life.

Preferred curing agents are free radical generators such as thermal initiators, which upon reacting with the photosensitive composition cause it to polymerize or crosslink. By exposing the coating composition to actinic radiation, and rupturing the capsules in the presence of a developer material, the chromogenic material and the developer react to produce color in the form of an image and the curing agent reacts with the photosensitive composition and hardens it, thereby preventing image diffusion. In the case of certain curing agents, it may be desirable to heat the image to accelerate the cure. A curing agent is preferably selected which is relatively inactive at room temperature (for good shelf life) and which is readily activated by heating to temperatures in excess of room temperature.

A particularly useful class of thermal initators reactive with ethylenically unsaturated compounds are organic peroxides. Suitable peroxides include diacyl peroxides, ketone peroxides, peroxydicarbonates, alkyl peroxides, alkyl hydroperoxides and sulfonyl peroxides. Also useful as thermal initiators are bisazides, perborates and diazo compounds.

Carrier oils conventionally used in forming pressure-sensitive microcapsules can be used in the present invention provided they are essentially inert to the curing agent. Deodorized kerosense, alkylated biphenyls and alkylated phthalates are examples.

The encapsulation process chosen must give a high yield of thermal initiator retained over extended periods of storage, whether in water dispersions or after being applied to a substrate. Also, the temperature during manufacture and storage must be maintained below levels that would cause rapid decomposition of the thermal initiator. For this reason, initiators which are not activated below about 25° C. are preferably used.

In some situations, peroxides can present a fire hazard. This problem can be avoided by limiting the amount used. Preferably, the amount of peroxide used should equal about 0.1 to 1.0 percent of the weight of photosensitive composition used. Thus, if three pounds of photosensitive composition capsules are used for 3,300 square feet of substrate paper, only 0.03 pounds of peroxide would be present at the 1% level of use. This level is about equal to 0.6 pounds of peroxide oil solution which is not explosive and can be burned safely.

The following examples illustrate the manufacture of the present invention and its effectiveness in stopping image diffusion.

The peroxide containing microcapsules used in the following examples were prepared as follows:

A batch of peroxide containing capsules was prepared by incorporating 5 grams of commercial peroxide into a dioctyl phthalate oil phase which is made from Lupersol PDO (made by Lucidol, Pennwalt). The total solution amounted to 50 grams. After heating to 60° C. the oil phase was added to a Waring blender, which contained a water phase at 60° C. already stirring at full power. The water phase contained 26.9 grams of a 17.1% Isobam solution whose pH was adjusted to 4.0, 38.3 grams of distilled water, 25 grams of a 10% aqueous gum arabic solution, 6.6 grams of dissolved urea and 0.8 grams of resorcinol. After the dispersion of the oil phase averaged about 5 microns, the power was reduced to about 40 volts and 17 milliliters of 37% formaldehyde solution was added. The combined solutions were mixed at 40 volts and 60° C. for two more hours. Then a solution of 0.6 grams of ammonium sulfate and 12.1 grams of water was added and mixed for fifteen additional minutes. The mixture was transferred to a beaker and further mixed at 60° C. for one hour. The pH was adjusted to 7.0 by drop-wise addition of a 10% sodium hydroxide solution, and the capsules were reserved for further use.

The photosensitive microcapsules used in the following examples were prepared as follows:

A batch of photosensitive capsules was prepared under darkroom conditions in the same way as the batch of peroxide capsules with two exceptions. The ingredients were doubled in amount and the oil phase comprised 100 grams of trimethlolpropenetriacrylate, 6 grams of Copikem IV (a product of Hilton-Davis Co.), 5 grams of benzoin methyl ether, and 2 grams of Michler's ketone. The final pH was adjusted to 9.0 and 5.6 grams of sodium bisulfite was added and dissolved. The capsules were placed in foil wrapped bottled to prevent premature exposure.

COMPARISON EXAMPLE

A portion of the photosensitive capsule batch 2 was diluted with an equal weight of a 10% sodium of gum arabic and then mixed well. Next the mixture was poured across the coated side of a sheet of Mead Transrite impact paper under darkroom conditions. The wet mixture was drawn in the machine direction by using a number 10 Mayer bar. The coating was dried in a circulating air oven for 2 minutes at 90° C.

Two strips of the dried coated surface were cooled, aged one hour in darkroom conditions and then each exposed imagewise to a Stouffer transparent sensitivity guide, which is a step wedge gray scale. The two strips were covered by Gilclear and then developed by running them through a laboratory super calender set at 20 pounds gauge, which is approximately equivalent to 600 pounds per linear inch of face contact. One of the developed sheets was placed in the 90° C. oven for 5 minutes. This produced a gray scale on each sample. The samples were placed in a heavy gray envelope to age. The effect of aging on the image density (the last gray scale step) is shown in Table 1 below.

EXAMPLE 1

The coating composition was prepared by mixing 10 grams of peroxide capsules with 90 grams of photosensitive capsules and 100 grams of a 10% solution of gum arabic. The pH was adjusted to 7.0.

This composition was used to coat paper and prepare exposed and developed samples as in the Comparison Example. The two resulting samples were placed in the same envelope as those from the Comparison. The effect of aging on image density is shown in Table 1.

EXAMPLE 2

A coating composition was prepared by mixing 20 grams of peroxide capsules with 80 grams of photosensitive capsules and 100 grams of a 10% solution of gum arabic. The pH was adjusted to 7.0. The procedure was otherwise the same as in Example 1. The results are shown in Table 1.

Table 1 shows the results of these tests measured by the last gray scale step of the sample images before visible gray scale change.

TABLE 1

| | | | Last Gray Scale Step | |
|---|---|---|---|---|
| Example | Imaging | Aging | 15 min. after Development | 60 days after Development |
| Comparison | 26° C. | 26° C. | 9 | 7 |
| Comparison | 26° C. | 5 min. at 90° C., then cooled to 26° C. | 8 | 7 |
| 1 | 26° C. | 26° C. | 9 | 9 |
| 1 | 26° C. | 5 min. at 90° C., then cooled to | 9 | 9 |

TABLE 1-continued

| Example | Imag-ing | Aging | Last Gray Scale Step | |
|---|---|---|---|---|
| | | | 15 min. after Development | 60 days after Development |
| | | 26° C. | | |
| 2 | 26° C. | 26° C. | 9 | 9 |
| 2 | 26° C. | 5 min. at 90° C. then cooled to 26° C. | 9 | 9 |

These results clearly indicate that the incorporation of peroxide capsules into the coating provides a precise and stable image over a long period of time. Although no tests were run, it is believed that improved smudge and solvent resistance and scuff proofness will also result. Additional testing did confirm that the organic peroxide remained active and that a very large fraction continued to be present in both the water-suspended encapsulation and on the dried papers prepared as in examples 4 and 5 for at least several months.

The foregoing descriptions are intended to be illustrative. They are not intended to define the scope of the invention, which is limited only by the claims that follow.

What is claimed is:

1. A coating composition for use in photoimaging said coating composition comprising a chromogenic material, rupturable microcapsules which contain a photohardenable or photosoftenable photosensitive composition, and a thermal initiator; said coating composition being characterized in that images are formed by imagewise exposing a coating of said composition to actinic radiation and rupturing said microcapsules in the image areas such that said chromogenic material can react with an associated co-reactive developer material to form a color image and said thermal initiator reacts with the photosensitive composition following capsule rupture to provide image stability upon aging.

2. The coating composition of claim 1 wherein said photosensitive composition includes a photopolymerizable ethylenically unsaturated compound.

3. The coating composition of claim 2 wherein said rupturable microcapsules have discrete capsule walls.

4. The coating composition of claim 3 wherein said thermal initiator is an organic peroxide.

5. The coating composition of claim 4 wherein the amount of said organic peroxide is less than 1% by weight of the amount of said photosensitive composition.

6. The coating composition of claim 5 wherein said organic peroxide is selected from the group consisting of diacyl peroxides, ketone peroxides, peroxydicarbonates, alkyl peroxides, alkyl hydroperoxides and sulfonyl peroxides.

7. The coating composition of claim 4 wherein said thermal initiator is present in said rupturable microcapsules with said photosensitive composition.

8. The coating composition of claim 4 wherein said thermal initiator is encapsulated in rupturable microcapsules having discrete capsule walls which are separate and distinct from said rupturable microcapsules containing said photosensitive composition.

9. A imaging sheet comprising a substrate, and a coating composition on one surface of said substrate, said composition including a chromogenic material, rupturable microcapsules which contain a photohardenable or photosoftenable photosensitive composition, and a thermal initiator, said imaging sheet being characterized in that images are formed by imagewise exposing said substrate to actinic radiation and rupturing said microcapsules in the image areas such that said chromogenic material reacts with a co-reactive developer material associated with said imaging sheet to form a color image and said thermal initiator reacts with the photosensitive composition released from said capsules to improve image stability upon aging.

10. The imaging sheet of claim 9 wherein said photosensitive composition includes a photopolymerizable ethylenically unsaturated compound.

11. The imagin;g sheet of claim 9 wherein said developer material is present on the same surface of said substrate as said coating composition.

12. The imaging sheet of claim 10 wherein said rupturable microcapsules containing said photosensitive composition have discrete capsule walls.

13. The imaging sheet of claim 12 wherein said thermal initiator is an organic peroxide.

14. The imaging sheet of claim 13 wherein the amount of said organic peroxide is less than 1% by weight of the amount of said photosensitive composition.

15. The imaging sheet of claim 14 wherein said organic peroxide is selected from the group consisting of diacyl peroxides, ketone proxides, peroxydicarbonates, alkyl peroxides, alkyl hydroperoxides and sulfonyl peroxides.

16. The imaging sheet of claim 13 wherein said thermal initiator is present in said rupturable microcapsules containing said photosensitive composition.

17. The imaging sheet of claim 13 wherein said thermal initiator is present in rupturable microcapsules having discrete capsule walls which are separate and distinct from said rupturable microcapsules containing said photosensitive composition.

18. An imaging system comprising first and second substrates, said first substrate carrying a coating composition including a chromogenic material, rupturable microcapsules which contain a photohardenable or photosoftenable photosensitive composition, and a thermal initiator, said second substrate carrying a developer material which reacts with said chromogenic material to form a color image, said imaging system being characterized in that images are formed by image-wise exposing said first substrate to actinic radiation and assembling said first substrate and said second substrate with said surfaces carrying said microcapsules and said developer in contact, and rupturing said microcapsules in the image areas such that said chromogenic material reacts with said developer to form a color image and said thermal initiator reacts with said photosensitive composition released from said capsules to improve image stability upon aging.

* * * * *